(12) United States Patent
Kamei et al.

(10) Patent No.: US 11,383,307 B2
(45) Date of Patent: Jul. 12, 2022

(54) ENTRY SHEET FOR DRILLING AND METHOD FOR DRILLING PROCESSING USING SAME

(71) Applicant: Mitsubishi Gas Chemical Company, Inc., Tokyo (JP)

(72) Inventors: Takayuki Kamei, Yonezawa (JP); Yousuke Matsuyama, Yonezawa (JP); Takaaki Ogashiwa, Yonezawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 15/756,899

(22) PCT Filed: Aug. 31, 2016

(86) PCT No.: PCT/JP2016/075472
§ 371 (c)(1),
(2) Date: Mar. 1, 2018

(87) PCT Pub. No.: WO2017/038867
PCT Pub. Date: Mar. 9, 2017

(65) Prior Publication Data
US 2018/0257148 A1 Sep. 13, 2018

(30) Foreign Application Priority Data
Sep. 2, 2015 (JP) .............................. JP2015-172761

(51) Int. Cl.
*B23B 41/14* (2006.01)
*B23B 47/28* (2006.01)
(Continued)

(52) U.S. Cl.
CPC .............. *B23B 41/14* (2013.01); *B23B 35/00* (2013.01); *B23B 47/28* (2013.01); *B26F 1/16* (2013.01);
(Continued)

(58) Field of Classification Search
CPC ...... B23B 41/14; B23B 35/00; C10M 111/04; C10M 2201/066; C10M 2205/0206;
(Continued)

(56) References Cited

U.S. PATENT DOCUMENTS 2,392,481 A    1/1946  Kaplan et al.
3,220,893 A   11/1965  Blackwood et al.
(Continued)

FOREIGN PATENT DOCUMENTS

CN    102504909 A    6/2012
CN    104203512 A   12/2014
(Continued)

OTHER PUBLICATIONS https://www.sigmaaldrich.com/catalog/product/aldrich/808113?lang=en&region=US (Year: 2018).
(Continued)

*Primary Examiner* — Maria V Ewald
*Assistant Examiner* — Ethan Weydemeyer
(74) *Attorney, Agent, or Firm* — Fitch, Even, Tabin & Flannery LLP

(57) ABSTRACT

An entry sheet for drilling comprising: a metallic foil; and a layer of a resin composition on at least one surface of the metallic foil, the resin composition comprising a polyolefin resin (A) and a water-soluble resin (B), wherein a content of the polyolefin resin (A) is 25 parts by mass or more and 50 parts by mass or less based on 100 parts by mass of the total of the polyolefin resin (A) and the water-soluble resin (B), a content of the water-soluble resin (B) is 50 parts by mass or more and 75 parts by mass or less based on 100 parts by mass of the total of the polyolefin resin (A) and the water-soluble resin (B), and the water-soluble resin (B) comprises
(Continued)

a high-molecular-weight water-soluble resin (B-1) having a weight average molecular weight of $2\times10^5$ or higher and $1.5\times10^6$ or lower.

10 Claims, 1 Drawing Sheet

(51) Int. Cl.
| | |
|---|---|
| B26F 1/16 | (2006.01) |
| C10M 107/28 | (2006.01) |
| B23B 35/00 | (2006.01) |
| H05K 3/00 | (2006.01) |
| C10M 111/04 | (2006.01) |
| C10N 20/04 | (2006.01) |
| C10N 40/22 | (2006.01) |
| C10N 50/02 | (2006.01) |
| C10M 107/04 | (2006.01) |
| C10M 107/34 | (2006.01) |
| C10M 107/36 | (2006.01) |

(52) U.S. Cl.
CPC .......... *C10M 107/28* (2013.01); *C10M 111/04* (2013.01); *H05K 3/0047* (2013.01); *C10M 107/04* (2013.01); *C10M 107/34* (2013.01); *C10M 107/36* (2013.01); *C10M 2201/066* (2013.01); *C10M 2205/0206* (2013.01); *C10M 2207/283* (2013.01); *C10M 2207/289* (2013.01); *C10M 2209/0845* (2013.01); *C10M 2209/103* (2013.01); *C10M 2209/104* (2013.01); *C10M 2209/105* (2013.01); *C10M 2209/108* (2013.01); *C10M 2209/123* (2013.01); *C10M 2217/024* (2013.01); *C10N 2020/04* (2013.01); *C10N 2040/22* (2013.01); *C10N 2050/02* (2013.01); *H05K 2203/0214* (2013.01)

(58) Field of Classification Search
CPC ...... C10M 2207/283; C10M 2207/289; C10M 2209/0845; C10M 2209/103; C10M 2209/108; C10M 2209/123; C10M 2217/024; C10N 2020/04; C10N 2040/22; C10N 2050/02; H05K 2203/0214
See application file for complete search history.

(56) References Cited

U.S. PATENT DOCUMENTS

| | | | |
|---|---|---|---|
| 4,052,323 A | 10/1977 | Feneberger et al. | |
| 4,519,732 A | 5/1985 | Sutcliffe | |
| 4,572,714 A | 2/1986 | Suzuki et al. | |
| 4,990,035 A | 2/1991 | Scheuch et al. | |
| 5,026,612 A | 6/1991 | Selwood et al. | |
| 5,082,402 A * | 1/1992 | Gaku | H05K 3/0047 408/1 R |
| 5,492,639 A | 2/1996 | Schneider et al. | |
| 5,507,603 A | 4/1996 | Nakano et al. | |
| 5,816,755 A | 10/1998 | Thelin | |
| 5,909,985 A | 6/1999 | Shiga et al. | |
| 6,164,876 A | 12/2000 | Cordovano | |
| 10,384,322 B2 | 8/2019 | Matsuyama et al. | |
| 10,518,341 B2 | 12/2019 | Matsuyama et al. | |
| 2002/0037400 A1 | 3/2002 | Fujiwara et al. | |
| 2002/0051684 A1 | 5/2002 | Eziri et al. | |
| 2002/0170178 A1 | 11/2002 | Zackrisson et al. | |
| 2003/0100456 A1 | 5/2003 | Hasaki et al. | |
| 2003/0152432 A1 | 8/2003 | Meece et al. | |
| 2004/0023059 A1 | 2/2004 | Kaburagi et al. | |
| 2004/0191016 A1 | 9/2004 | Hintze et al. | |
| 2005/0003169 A1 * | 1/2005 | Ikeguchi | B23B 35/00 428/195.1 |
| 2005/0123363 A1 | 6/2005 | Ahmkiel et al. | |
| 2007/0127997 A1 | 6/2007 | Muselli et al. | |
| 2008/0170917 A1 | 7/2008 | Hilker | |
| 2010/0028671 A1 * | 2/2010 | Mitsui | B32B 7/12 428/354 |
| 2010/0054871 A1 | 3/2010 | Prakash | |
| 2010/0172708 A1 | 7/2010 | Bolin et al. | |
| 2012/0020749 A1 | 1/2012 | Maeda et al. | |
| 2012/0039680 A1 | 2/2012 | Koike et al. | |
| 2012/0051863 A1 | 3/2012 | Craig et al. | |
| 2012/0219371 A1 | 8/2012 | Craig | |
| 2012/0282044 A1 | 11/2012 | Volokh et al. | |
| 2012/0294689 A1 | 11/2012 | Yagista | |
| 2012/0315547 A1 | 12/2012 | Itoh et al. | |
| 2013/0017025 A1 | 1/2013 | Azegami | |
| 2013/0020735 A1 | 1/2013 | Hintze et al. | |
| 2013/0170920 A1 | 7/2013 | Ogawa | |
| 2013/0209184 A1 | 8/2013 | Barry et al. | |
| 2013/0209190 A1 | 8/2013 | Oode et al. | |
| 2014/0260884 A1 | 9/2014 | Hsieh | |
| 2015/0072122 A1 * | 3/2015 | Kamei | B26F 1/16 428/215 |
| 2015/0111049 A1 * | 4/2015 | Matsuyama | H05K 3/0047 428/464 |
| 2015/0125228 A1 * | 5/2015 | Sugimoto | B26F 1/16 408/1 R |
| 2015/0298355 A1 | 10/2015 | Ohlendorf | |
| 2016/0045961 A1 | 2/2016 | Umehara et al. | |
| 2017/0009171 A1 | 1/2017 | Soto-Castillo et al. | |
| 2017/0100781 A1 | 4/2017 | Zhang et al. | |
| 2017/0106606 A1 | 4/2017 | Toyozumi et al. | |
| 2017/0111997 A1 | 4/2017 | Matsuyama et al. | |
| 2017/0274461 A1 | 9/2017 | Mabuchi et al. | |
| 2018/0229339 A1 | 8/2018 | Matsuyama et al. | |

FOREIGN PATENT DOCUMENTS

| | | |
|---|---|---|
| CN | 104245256 A | 12/2014 |
| CN | 104321173 A | 1/2015 |
| CN | 105073355 A | 11/2015 |
| DE | 3531786 A1 | 3/1987 |
| EP | 0571352 A2 | 11/1993 |
| EP | 0608920 A1 | 8/1994 |
| EP | 0642297 A1 | 3/1995 |
| EP | 2979832 A1 | 2/2016 |
| EP | 3069709 A1 | 9/2016 |
| EP | 3333245 A1 | 6/2018 |
| EP | 3342517 A1 | 7/2018 |
| JP | S50-053768 A | 5/1975 |
| JP | S56-095991 A | 8/1981 |
| JP | 57-107718 A | 7/1982 |
| JP | S58-019716 B2 | 4/1983 |
| JP | H04-092494 A | 3/1992 |
| JP | H05-169400 A | 7/1993 |
| JP | H07-11210 U | 2/1995 |
| JP | H07-112311 A | 5/1995 |
| JP | H10-110183 A | 4/1998 |
| JP | 2000-015624 A | 1/2000 |
| JP | 2001-047307 A | 2/2001 |
| JP | 2001-098291 A | 4/2001 |
| JP | 2001-347602 A | 12/2001 |
| JP | 2002-301632 A | 10/2002 |
| JP | 2003-136485 A | 5/2003 |
| JP | 2003-175412 A | 6/2003 |
| JP | 2003-225814 A | 8/2003 |
| JP | 2003-301187 A | 10/2003 |
| JP | 2004-230470 A | 8/2004 |
| JP | 2005-019657 A | 1/2005 |
| JP | 2006-150557 A | 6/2006 |
| JP | 2006-181657 A | 7/2006 |
| JP | 2008-222762 A | 9/2008 |
| JP | 2011-020248 A | 2/2011 |
| JP | 2011-183548 A | 9/2011 |
| JP | 2012-178550 A | 9/2012 |
| JP | 2012-210689 A | 11/2012 |
| JP | 2013-146819 A | 8/2013 |

(56) References Cited

FOREIGN PATENT DOCUMENTS

| | | | |
|---|---|---|---|
| JP | 2014-019157 | A | 2/2014 |
| JP | 2015-160275 | A | 9/2015 |
| KR | 100270173 | B1 | 11/2000 |
| KR | 100635108 | B1 | 10/2006 |
| SG | 11201506893 | U | 9/2015 |
| SG | 11201710736 | A | 1/2018 |
| TW | 201349966 | A | 12/2013 |
| WO | 2012/091179 | A1 | 7/2012 |
| WO | 2013/132837 | A1 | 9/2013 |
| WO | 2013/141299 | A1 | 9/2013 |
| WO | 2013/146612 | A1 | 10/2013 |
| WO | 2014/157570 | A1 | 10/2014 |
| WO | 2015/152162 | A1 | 10/2015 |
| WO | 2017/022822 | A1 | 2/2017 |

OTHER PUBLICATIONS

Zalucha et al., The Chemistry of Structural Adhesives: Epoxy, Urethane, and Acrylic Adhesives, 2007, p. 291 (Year: 2007).

\* cited by examiner

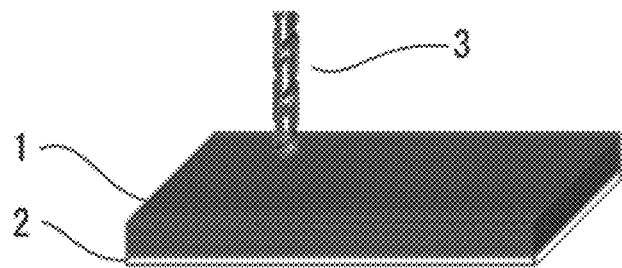

ENTRY SHEET FOR DRILLING AND METHOD FOR DRILLING PROCESSING USING SAME

CROSS-REFERENCE TO RELATED APPLICATIONS

This application is a U.S. national phase application filed under 35 U.S.C. § 371 of International Application PCT/JP2016/075472, filed on Aug. 31, 2016, designating the United States, which claims priority from Japanese Application Number 2015-172761, filed Sep. 2, 2015.

FIELD OF THE INVENTION

The present invention relates to an entry sheet for drilling and a method for drilling processing using the same.

BACKGROUND OF THE INVENTION

As a method for drilling processing of a laminated board or a multi-layer board used in a printed wiring board material, a method has been generally adopted including piling one or more laminated boards or multi-layer boards, arranging, as an entry board, an aluminum foil alone or a sheet obtained by forming a layer of a resin composition on a surface of the aluminum foil (hereinafter, the "sheet" is referred to as "entry sheet for drilling") on the top of the laminated board or multi-layer board, and conducting drilling processing.

In recent years, as the improvements in reliability are demanded for printed wiring boards, and the high densification of the printed wiring boards progresses, high-quality drilling processing including the improvements in hole position accuracy and the reduction in roughness of hole walls has been demanded for the drilling processing of a laminated board or a multi-layer board.

To meet above-described demands such as the improvements in hole position accuracy and the reduction in roughness of hole walls, a method for drilling processing using a sheet containing a water-soluble resin such as a polyethylene glycol is proposed in Patent Literature 1. Moreover, a lubricant sheet for drilling obtained by forming a water-soluble resin layer on a metallic foil is proposed in Patent Literature 2. Further, an entry sheet for drilling obtained by forming a water-soluble resin layer on aluminum foil provided with a thin film of a thermosetting resin formed thereon is proposed in Patent Literature 3. Furthermore, a lubricant sheet for drilling in which a non-halogen colorant is blended in a lubricating resin composition is proposed in Patent Literature 4.

As one example of the entry sheet for drilling, an entry sheet is proposed comprising a metallic foil and a layer of a resin composition, the layer formed on at least one surface of the metallic foil. However, the adhesion strength between the metallic foil and the layer of the resin composition is weak, and therefore the layer of the resin composition is peeled during drilling processing in the configuration of the entry sheet for drilling in which the metallic foil and the layer of the resin composition are in direct contact with each other, and the drill steps on the peeled layer of the resin composition, resulting in the deterioration of the hole position accuracy and the increase in the frequency of breakage of the drill in many cases. Moreover, the entry sheet for drilling is usually used in drilling processing in such a way that the entry sheet is arranged on both surfaces of a plurality of laminated boards or multi-layer boards to make a set with a tape for fixation; however, the tape for fixation may be peeled together with the layer of the resin composition and the position of the entry sheet may be shifted. Therefore, the entry sheet for drilling practically used includes an adhesion layer (adhesion film) containing a urethane-based compound, a vinyl acetate-based compound, a vinyl chloride-based compound, a polyester-based compound, a copolymerized product thereof, an epoxy-based compound, a cyanate-based compound, or the like formed between the metallic foil and the layer of the resin composition in order to improve the adhesion strength between the metallic foil and the layer of the resin composition (see, for example, Patent Literature 5).

CITATION LIST

Patent Literature

Patent Literature 1
 Japanese Patent Laid-Open No. 4-92494
Patent Literature 2
 Japanese Patent Laid-Open No. 5-169400
Patent Literature 3
 Japanese Patent Laid-Open No. 2003-136485
Patent Literature 4
 Japanese Patent Laid-Open No. 2004-230470
Patent Literature 5
 Japanese Patent Laid-Open No. 2011-183548

SUMMARY OF INVENTION

On the other hand, however, when the adhesion layer is provided between the metallic foil and the layer of the resin composition, the lubricating effect of the resin composition is prevented by the adhesion layer, and therefore the hole position accuracy and the roughness of hole walls, which are important properties required for an entry sheet for drilling, may be deteriorated. Thus, the development of an entry sheet for drilling having a strong adhesion strength between the metallic foil and the layer of the resin composition and having excellent hole position accuracy and roughness of inner walls without providing the adhesion layer between the metallic foil and the layer of the resin composition has been earnestly desired.

The present invention has been completed in consideration of the above problem, and an object of the present invention is to provide an entry sheet for drilling having a strong adhesion strength between the metallic foil and the layer of the resin composition and having an excellent hole position accuracy during drilling processing even in the case where an adhesion layer is not provided between the metallic foil and the layer of the resin composition; and to provide a method for drilling processing using the entry sheet for drilling.

The present inventors have conducted various studies for the purpose of solving the problem, and have found that when a layer of a resin composition formed on the surface of a metallic foil comprises a polyolefin resin (A) and a water-soluble resin (B); the content of the polyolefin resin (A) and of the water-soluble resin (B) in the layer of the resin composition are each in a particular range; and the water-soluble resin (B) comprises a predetermined high molecular weight component, the problem can be solved, thereby completed the present invention.

That is, the present invention is as follows.

[1]
 An entry sheet for drilling comprising:
 a metallic foil; and
 a layer of a resin composition on at least one surface of the metallic foil, the resin composition comprising a polyolefin resin (A) and a water-soluble resin (B), wherein a content of the polyolefin resin (A) is 25 parts by mass or more and 50 parts by mass or less based on 100 parts by mass of a total of the polyolefin resin (A) and the water-soluble resin (B), a content of the water-soluble resin (B) is 50 parts by mass or more and 75 parts by mass or less based on 100 parts by mass of the total of the polyolefin resin (A) and the water-soluble resin (B), and the water-soluble resin (B) comprises a high-molecular-weight water-soluble resin (B-1) having a weight average molecular weight of $2\times10^5$ or higher and $1.5\times10^6$ or lower.

[2]

The entry sheet for drilling according to [1], wherein the polyolefin resin (A) comprises an olefin-(meth)acrylic acid copolymer having a constituent unit derived from an olefin and a constituent unit derived from acrylic acid and/or methacrylic acid.

[3]

The entry sheet for drilling according to [2], wherein the constituent unit derived from the olefin comprises a constituent unit derived from ethylene.

[4]

The entry sheet for drilling according to [2] or [3], wherein the olefin-(meth)acrylic acid copolymer is an ethylene-(meth)acrylic acid block copolymer having a structure represented by the following formula (1):

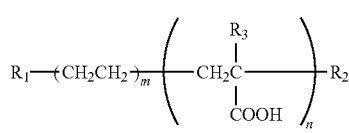

(1)

wherein $R_1$, $R_2$, and $R_3$ each independently represent a hydrogen atom or a methyl group, and m and n each independently represent an integer of 1 or more.

[5]

The entry sheet for drilling according to any one of [2] to [4], wherein a content of the constituent unit derived from the olefin in the olefin-(meth)acrylic acid copolymer is 60 to 99 mol % based on 100 mol % of a total of the constituent unit derived from an olefin and the constituent unit derived from acrylic acid and/or methacrylic acid.

[6]

The entry sheet for drilling according to any one of [1] to [5], wherein the polyolefin resin (A) has a weight average molecular weight of $5\times10^3$ or higher and $1\times10^5$ or lower.

[7]

The entry sheet for drilling according to any one of [1] to [6], wherein the water-soluble resin (B) comprises a low-molecular-weight water-soluble resin (B-2) having a weight average molecular weight of $1\times10^3$ or higher and $7\times10^3$ or lower.

[8]

The entry sheet for drilling according to any one of [1] to [7], wherein the water-soluble resin (B) comprises one or more selected from the group consisting of polyethylene oxide; polypropylene oxide; polyvinylpyrrolidone; cellulose derivatives; polyethylene glycol; polypropylene glycol; polytetramethylene glycol; monoether compounds of polyoxyethylene; polyoxyethylene monostearate; polyoxyethylene sorbitan monostearate; polyglycerin monostearate compounds; a polyethylene oxide-polypropylene oxide copolymer; and derivatives thereof.

[9]

The entry sheet for drilling according to any one of [1] to [8], wherein the layer of the resin composition has a thickness of 0.02 to 0.3 mm.

[10]

The entry sheet for drilling according to any one of [1] to [9], wherein the metallic foil has a thickness of 0.05 to 0.5 mm.

[11]

A method for drilling processing, the method comprising forming a hole in a laminated board or a multi-layer board using the entry sheet for drilling according to any one of [1] to [10].

According to the present invention, an entry sheet for drilling having a strong adhesion strength between the metallic foil and the layer of the resin composition and having an excellent hole position accuracy during drilling processing, and a method for drilling processing using the entry sheet for drilling can be provided even in the case where an adhesion layer is not provided between the metallic foil and the layer of the resin composition. Moreover, since there is no need to provide an adhesion layer, raw material cost can be reduced, and the production process of the entry sheet for drilling can be simplified.

BRIEF DESCRIPTION OF DRAWING

FIG. 1 shows a schematic diagram illustrating one aspect of an entry sheet for drilling according to the present embodiment and of a method for drilling processing using the entry sheet for drilling.

DESCRIPTION OF EMBODIMENTS

Hereinafter, an embodiment according to the present invention (hereinafter, referred to as "the present embodiment") will be described in detail; however, the present invention is not limited to the present embodiment, and various modifications can be made without a range departing from the scope of the present invention.

[Entry Sheet for Drilling]

An entry sheet for drilling according to the present embodiment (hereinafter, also simply referred to as "entry sheet") comprises: a metallic foil; and a layer of a resin composition on at least one surface of the metallic foil, the resin composition comprising a polyolefin resin (A) and a water-soluble resin (B), wherein a content of the polyolefin resin (A) is 25 parts by mass or more and 50 parts by mass or less based on 100 parts by mass of the total of the polyolefin resin (A) and the water-soluble resin (B), a content of the water-soluble resin (B) is 50 parts by mass or more and 75 parts by mass or less based on 100 parts by mass of the total of the polyolefin resin (A) and the water-soluble resin (B), and the water-soluble resin (B) comprises a high-molecular-weight water-soluble resin (B-1) having a weight average molecular weight of $2\times10^5$ or higher and $1.5\times10^6$ or lower.

FIG. 1 illustrates one aspect of the entry sheet for drilling according to the present embodiment and of a method for drilling processing using the entry sheet for drilling. As illustrated in FIG. 1, the entry sheet according to the present embodiment comprises a metallic foil 2 and a layer 1 of a resin composition, the layer arranged on at least one surface of the metallic foil 2. When the layer 1 of the resin composition comprising the composition is used, the entry sheet having a strong adhesion strength between the metallic foil 2 and the layer 1 of the resin composition and having an excellent hole position accuracy during drilling processing is made even in the case where an adhesion layer is not provided between the metallic foil 2 and the layer 1 of the resin composition. Accordingly, the entry sheet according to the present embodiment needs not have an adhesion layer, which is for adjusting the adhesion force between the metallic foil and the layer of the resin composition, between the metallic foil and the layer of the resin composition. Hereinafter, the constitution of the entry sheet will be described in detail.

[Metallic Foil]

The metallic foil is not particularly limited but is preferably a metallic material that has high adhesion with the layer of the resin composition, which will be described later, and can endure the shock by a drill bit. Examples of the kind of metal of the metallic foil include aluminum from the viewpoint of availability, cost, and processability. It is preferable that the material quality of aluminum foil be aluminum having a purity of 95% or more. Examples of such aluminum foil include 5052, 3004, 3003, 1N30, 1N99, 1050, 1070, 1085, and 8021 specified in JIS-H4160. By using aluminum foil having an aluminum purity of 95% or more as the metallic foil, the shock by the drill bit is lessened, the biting property with the tip of the drill bit is improved, and these are coupled with the lubricating effect to the drill bit by the resin composition to enable the hole position accuracy of processed holes to be enhanced further.

The thickness of the metallic foil is not particularly limited but is preferably 0.05 to 0.5 mm, more preferably 0.05 to 0.3 mm. When the metallic foil has a thickness of 0.05 mm or more, there is a tendency that the generation of burrs from the object of drilling (for example, laminated board) during drilling processing can be suppressed further. Moreover, when the metallic foil has a thickness of 0.5 mm or less, there is a tendency that the discharge of chips generated during drilling processing becomes easier.

The thickness of each layer that constitutes the entry sheet according to the present embodiment is measured in the following manner. Firstly, the entry sheet is cut in the lamination direction of each layer using a cross-section polisher (manufactured by JEOL Ltd., trade name "CROSS-SECTION POLISHER SM-09010") or an ultramicrotome (manufactured by Leica, item number "EM UC7"). Thereafter, the cross section appeared by cutting is observed from a vertical direction relative to the cross section to measure the thicknesses of each constituent layer, such as, for example, the metallic foil and the layer of the resin composition, using a SEM (Scanning Electron Microscope, manufactured by KEYENCE CORPORATION, item number "VE-7800"). The thicknesses at 5 points to 1 view are measured, and the mean is determined to be the thickness of each layer.

[Layer of Resin Composition]

The layer of the resin composition is arranged on at least one surface of the metallic foil and comprises a polyolefin resin (A) and a water-soluble resin (B).

(Polyolefin Resin (A))

The polyolefin resin (A) is not particularly limited, and examples thereof include homopolymers of an olefin; and copolymers of an olefin and another comonomer that is copolymerizable with the olefin. Examples of the olefin herein include ethylene, propylene, butylene, hexene, and octene. Among these, ethylene and propylene are preferable, and ethylene is more preferable. The polyolefin resins (A) may be used singly, or two or more thereof may be used together.

The homopolymers of an olefin are not particularly limited, and examples thereof include polyethylene-based resins, polypropylene-based resins, polybutadiene-based resins, cycloolefin-based resins, and polybutene-based resins.

Moreover, the comonomer that constitutes the copolymers of an olefin is not particularly limited as long as the comonomer has a functional group that is polymerizable with the olefin, and examples thereof include vinyl-based monomers such as vinyl acetate and vinyl alcohol; unsaturated carboxylic acid-based monomers such as acrylic acid, methacrylic acid, maleic acid, itaconic acid, and fumaric acid; and unsaturated ester-based monomers such as a methacrylate and an acrylate. In addition, resins having two kinds of constituent units derived from an olefin, such as ethylene-propylene copolymer-based resins are included in the copolymers of an olefin.

Among these, as the polyolefin resin (A), copolymers comprising a constituent unit derived from an olefin and a constituent unit derived from an unsaturated carboxylic acid-based monomer (hereinafter, also referred to as "olefin-unsaturated carboxylic acid copolymers"), copolymers comprising a constituent unit derived from an olefin and a constituent unit derived from acrylic acid and/or methacrylic acid (hereinafter, also referred to "(meth)acrylic acid") (hereinafter, referred to as "olefin-(meth)acrylic acid copolymers") are more preferable, copolymers comprising a constituent unit derived from ethylene and a constituent unit derived from acrylic acid and/or methacrylic acid (hereinafter, also referred to as "ethylene-(meth)acrylic acid copolymers") are still more preferable, and copolymers comprising a constituent unit derived from ethylene and a constituent unit derived from acrylic acid are particularly preferable. When such a polyolefin resin (A) is used, there is a tendency that the adhesion strength between the metallic foil and the layer of the resin composition is further improved and peeling of the layer of the resin composition during drilling processing to be a cause for a poor hole position accuracy and breakage of a drill is further suppressed. Thus, there is a tendency that the hole position accuracy is further improved, and the service life in drilling processing becomes further longer.

The above-described olefin-(meth)acrylic acid copolymers are not particularly limited, and examples thereof include an ethylene-(meth)acrylic acid block copolymer having a structure represented by the following formula (1). When such an ethylene-(meth)acrylic acid block copolymer is used, there is a tendency that the adhesion strength between the metallic foil and the layer of the resin composition is further improved and the hole position accuracy during drilling processing is further improved. Particularly, when the block copolymer is used, the crystallinity is further sufficiently improved and the block copolymer melts efficiently during drilling processing, so that there is a tendency that the hole position accuracy is further improved.

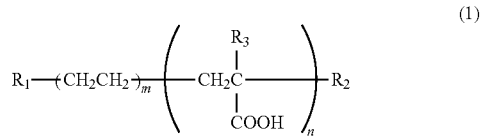

(1)

wherein $R_1$, $R_2$, and $R_3$ each independently represent a hydrogen atom or a methyl group, and m and n each independently represent an integer of 1 or more.

In the formula (1), m is 1 or more, preferably 200 or more, and more preferably 500 or more. The upper limit of m is not particularly limited but is preferably 3400 or less, more preferably 2500 or less, and still more preferably 2000 or less. Moreover, in the formula (1), n is 1 or more, preferably 50 or more, and more preferably 100 or more. The upper limit of n is not particularly limited but is preferably 870 or less, more preferably 750 or less, and still more preferably 500 or less.

In addition, the ethylene-(meth)acrylic acid block copolymer may be used singly, or two or more of the ethylene-(meth)acrylic acid block copolymers in which $R_1$, $R_2$, $R_3$, m, or n is different may be used together.

In the olefin-unsaturated carboxylic acid copolymers, the content of the constituent unit derived from an olefin is preferably 60 to 99 mol %, more preferably 65 to 95 mol %, and still more preferably 80 to 95 mol % based on 100 mol % of the total of the constituent unit derived from an olefin and the constituent unit derived from an unsaturated carboxylic acid monomer. Moreover, the content of the constituent unit derived from an unsaturated carboxylic acid is preferably 1 to 40 mol %, more preferably 5 to 35 mol %, and still more preferably 5 to 20 mol % based on 100 mol % of the total of the constituent unit derived from an olefin and the constituent unit derived from an unsaturated carboxylic acid monomer. When the content of the constituent unit derived from an olefin is 60 mol % or more, the crystallinity of the copolymer is sufficient and the copolymer melts efficiently during drilling processing, so that there is a tendency that the performance of discharging cutting chips is good, thereby making the hole position accuracy excellent or making the service life in drilling processing long. On the other hand, when the content of the constituent unit derived from an unsaturated carboxylic acid monomer is 1 mol % or more, there is a tendency that the stability when the copolymer is produced as an aqueous dispersion is further improved.

In the olefin-(meth)acrylic acid copolymers, the content of the constituent unit derived from an olefin is preferably 60 to 99 mol %, more preferably 65 to 95 mol %, and still more preferably 80 to 95 mol % based on 100 mol % of the total of the constituent unit derived from an olefin and the constituent unit derived from (meth)acrylic acid. Moreover, the content of the constituent unit derived from (meth)acrylic acid is preferably 1 to 40 mol %, more preferably 5 to 35 mol %, and still more preferably 5 to 20 mol % based on 100 mol % of the total of the constituent unit derived from an olefin and the constituent unit derived from (meth)acrylic acid. When the content of the constituent unit derived from an olefin is 60 mol % or more, the crystallinity of the copolymer is sufficient and the copolymer melts efficiently during drilling processing, so that there is a tendency that the performance of discharging cutting chips is good, thereby making the hole position accuracy excellent or making the service life in drilling processing long. On the other hand, when the content of the constituent unit derived from (meth)acrylic acid is 1 mol % or more, there is a tendency that the stability when the copolymer is produced as an aqueous dispersion is further improved.

In the ethylene-(meth)acrylic acid copolymer represented by the formula (1), the content of the constituent unit derived from ethylene is preferably 60 to 99 mol %, more preferably 65 to 95 mol %, and still more preferably 80 to 95 mol % based on 100 mol % of the total of the constituent unit derived from ethylene and the constituent unit derived from (meth)acrylic acid. Moreover, the content of the constituent unit derived from (meth)acrylic acid is preferably 1 to 40 mol %, more preferably 5 to 35 mol %, and still more preferably 5 to 20 mol % based on 100 mol % of the total of the constituent unit derived from ethylene and the constituent unit derived from (meth)acrylic acid. When the content of the constituent unit derived from ethylene is 60 mol % or more, the crystallinity of the copolymer is sufficient and the copolymer melts efficiently during drilling processing, so that there is a tendency that the performance of discharging cutting chips is good, thereby making the hole position accuracy excellent or making the service life in drilling processing long. On the other hand, when the content of the constituent unit derived from (meth)acrylic acid is 1 mol % or more, the copolymer can be produced as an aqueous dispersion. Particularly, when the ratio of the number of constituent units derived from ethylene (m) to the number of constituent units derived from (meth)acrylic acid (n) (m:n) in the ethylene-(meth)acrylic acid copolymer is from 80:20 to 95:5, there is a tendency that the hole position accuracy during drilling processing is further excellent.

When the ethylene-(meth)acrylic acid copolymer represented by the formula (1) is an ethylene-acrylic copolymer, the content of the constituent unit derived from ethylene is preferably 60 to 99 mol %, more preferably 65 to 95 mol %, and still more preferably 80 to 95 mol % based on 100 mol % of the total of the constituent unit derived from ethylene and the constituent unit derived from acrylic acid. Moreover, the content of the constituent unit derived from acrylic acid is preferably 1 to 40 mol %, more preferably 5 to 35 mol %, and still more preferably 5 to 20 mol % based on 100 mol % of the total of the constituent unit derived from ethylene and the constituent unit derived from acrylic acid. When the content of the constituent unit derived from ethylene is 60 mol % or more, the crystallinity of the copolymer is sufficient and the copolymer melts efficiently during drilling processing, so that there is a tendency that the performance of discharging cutting chips is good, thereby making the hole position accuracy excellent or making the service life in drilling processing long. On the other hand, when the content of the constituent unit derived from acrylic acid is 1 mol % or more, there is a tendency that the copolymer can be produced as an aqueous dispersion. Particularly, when the ratio (molar ratio) of the number of constituent units derived from ethylene to the number of constituent units derived from acrylic acid in the ethylene-acrylic acid copolymer is from 80:20 to 95:5, there is a tendency that the hole position accuracy during drilling processing is further excellent.

The weight average molecular weight of the polyolefin resin (A) is not particularly limited but is preferably $5 \times 10^3$ or higher and $1 \times 10^5$ or lower, more preferably $2 \times 10^4$ or higher and $8 \times 10^4$ or lower, and still more preferably $4 \times 10^4$ or higher and $7 \times 10^4$ or lower. When the weight average molecular weight is $5 \times 10^4$ or higher, there is a tendency that blocking is further suppressed and handling properties are further improved. Moreover, when the average molecular weight is $1 \times 10^5$ or lower, there is a tendency that the performance of discharging cutting chips is further improved, the hole position accuracy is further improved, and the breakage of a drill is further suppressed during drilling processing. The average molecular weight of the polyolefin resin (A) can be measured using a GPC column and polystyrene as a standard substance according to a usual method.

The content of the polyolefin resin (A) in the layer of the resin composition is 25 parts by mass or more and 50 parts by mass or less, preferably 30 parts by mass or more and 50 parts by mass or less based on 100 parts by mass of the total of the polyolefin resin (A) and the water-soluble resin (B).

When the content of the polyolefin resin (A) is 25 parts by mass or more, the adhesion strength between the metallic foil and the layer of the resin composition is further improved, and therefore peeling of the layer of the resin composition during drilling processing to be a cause for a poor hole position accuracy and breakage of a drill is further suppressed. Thus, the hole position accuracy is improved, and the service life in drilling processing becomes long. On the other hand, when the content of the polyolefin resin (A) is 50 parts by mass or less, the content of the water-soluble resin (B) in the layer of the resin composition can be adjusted in such an amount that gives a sufficient lubricity for drilling processing, and therefore the hole position accuracy during drilling processing is improved. Particularly, when the content of the polyolefin resin (A) is 30 parts by mass or more and 50 parts by mass or less, there is a tendency that both the adhesion strength between the metallic foil and the layer of the resin composition and the hole position accuracy during drilling processing are further improved.

The method for producing the polyolefin resin (A) being a homopolymer is not particularly limited, and conventionally known methods can be used. Also, the method for producing the polyolefin resin (A) being a copolymer is not particularly limited, and a method for polymerizing an olefin monomer and a comonomer by a conventionally known method can be used. The method for producing the above-described olefin-unsaturated carboxylic acid copolymers is not particularly limited, and the olefin-unsaturated carboxylic acid copolymers can be produced, for example, by subjecting an olefin monomer such as an ethylene monomer or a propylene monomer and an unsaturated carboxylic acid-based monomer to copolymerization reaction.

(Water-Soluble Resin (B))

The water-soluble resin (B) is not particularly limited as long as the water-soluble resin (B) is a resin having water-solubility but is preferably one or more selected from the group consisting of polyethylene oxide; polypropylene oxide; polyvinylpyrrolidone; cellulose derivatives; polyethylene glycol; polypropylene glycol; polytetramethylene glycol; monoether compounds of polyoxyethylene; polyoxyethylene monostearate; polyoxyethylene sorbitan monostearate; polyglycerin monostearate compounds; a polyethylene oxide-polypropylene oxide copolymer; and derivatives thereof. When such a water-soluble resin (B) is used, there is a tendency that the formability of the layer of the resin composition and the effect of the entry sheet as a lubricant are further improved. It is to be noted that the "resin having water-solubility" refers to a resin that dissolves in an amount of 1 g or more in 100 g of water at 25° C. and 1 atm.

The content of the water-soluble resin (B) is 50 parts by mass or more and 75 parts by mass or less, preferably 50 parts by mas or more and 70 parts by mass or less based on 100 parts by mass of the total of the polyolefin resin (A) and the water-soluble resin (B). When the content of the water-soluble resin (B) is 50 parts by mass or more, a uniform layer of the resin composition can be formed and a sufficient lubricity for drilling processing can be imparted to the layer of the resin composition. Thus, the hole position accuracy during drilling processing is further improved. On the other hand, when the content of the water-soluble resin (B) is 75 parts by mass or less, the content of the polyolefin resin (A) in the layer of the resin composition is increased, and as a result, the adhesion strength between the metallic foil and the layer of the resin composition is further improved and the hole position accuracy during drilling processing is further improved.

(High-Molecular-Weight Water-Soluble Resin (B-1))

In the present embodiment, the water-soluble resin (B) comprises a high-molecular-weight water-soluble resin (B-1) having a weight average molecular weight of $2 \times 10^5$ or higher and $1.5 \times 10^6$ or lower. When such a high-molecular-weight water-soluble resin (B-1) is used, the sheet-forming property of the layer of the resin composition is further improved, the layer of the resin composition having a higher strength can be formed, moreover, the thickness of the layer of the resin composition can be made uniform, and furthermore, the adhesion between the surface of the layer of the resin composition and the metallic foil becomes high, so that the hole position accuracy during drilling processing is further improved, and the adhesion force between the metallic foil and the layer of the resin composition becomes strong.

The high-molecular-weight water-soluble resin (B-1) is not particularly limited, and examples thereof include polyethylene oxide, polypropylene oxide, polyvinylpyrrolidone, and cellulose derivatives. Among these, polyethylene oxide and polyvinylpyrrolidone are preferable, and polyethylene oxide is particularly preferable. When such a high-molecular-weight water-soluble resin (B-1) is used, there is a tendency that the sheet-forming property is further improved. The high-molecular-weight water-soluble resins (B-1) may be used singly or in combinations of two or more.

The high-molecular-weight water-soluble resin (B-1) has a weight average molecular weight of $2 \times 10^5$ or higher, preferably $2.5 \times 10^5$ or higher, more preferably $3.0 \times 10^5$ or higher, and particularly preferably $5.0 \times 10^5$ or higher. Moreover, the high-molecular-weight water-soluble resin (B-1) has a weight average molecular weight of $1.5 \times 10^6$ or lower, preferably $1.35 \times 10^6$ or lower, and more preferably $1.25 \times 10^6$ or lower. When the high-molecular-weight water-soluble resin (B-1) has a weight average molecular weight in the range, there is a tendency that the hole position accuracy during the drilling processing is further improved, and the adhesion force between the metallic foil and the layer of the resin composition becomes strong.

The content of the high-molecular-weight water-soluble resin (B-1) is not particularly limited but is preferably 1 part by mass or more and 40 parts by mass or less, more preferably 2.5 parts by mass or more and 35 parts by mass or less, and still more preferably 5 parts by mass or more and 30 parts by mass or less based on 100 parts by mass of the total of the polyolefin resin (A) and the water-soluble resin (B). When the content of the high-molecular-weight water-soluble resin (B-1) is in the range, there is a tendency that the hole position accuracy during drilling processing is further improved.

(Low-Molecular-Weight Water-Soluble Resin (B-2))

Moreover, it is preferable that the water-soluble resin (B) further comprise a low-molecular-weight water-soluble resin (B-2) having a weight average molecular weight of $1 \times 10^3$ or higher and $7 \times 10^3$ or lower. When such a low-molecular-weight water-soluble resin (B-2) is used, there is a tendency that the effect of the entry sheet as a lubricant is further improved and the hole position accuracy during drilling processing is further improved.

The low-molecular-weight water-soluble resin (B-2) is not particularly limited, and examples thereof include: glycol compounds such as polyethylene glycol, polypropylene glycol, and polytetramethylene glycol; monoether compounds of polyoxyethylene such as polyoxyethylene oleyl ether, polyoxyethylene cetyl ether, polyoxyethylene stearyl ether, polyoxyethylene lauryl ether, polyoxyethylene nonylphenyl ether, and polyoxyethylene octylphenyl ether; and polyoxyethylene monostearate, polyoxyethylene sorbitan monostearate, polyglycerin monostearate compounds, a polyoxyethylene-propylene copolymer, and derivatives thereof. Among these, glycol compounds are preferable, and polyethylene glycol is more preferable. When such a low-molecular-weight water-soluble resin (B-2) is used, there is a tendency that the effect of the entry sheet as a lubricant is further improved and the hole position accuracy during drilling processing is further improved. The low-molecular-weight water-soluble resins (B-2) may be used singly or in combinations of two or more.

The low-molecular-weight water-soluble resin (B-2) has a weight average molecular weight of $1\times10^3$ or higher and $7\times10^3$ or lower, preferably $1.5\times10^3$ or higher and $6\times10^3$ or lower, and more preferably $2\times10^3$ or higher and $5\times10^3$ or lower. When the low-molecular-weight water-soluble resin (B-2) has a weight average molecular weight in the range, there is a tendency that the effect of the entry sheet as a lubricant is further improved and the hole position accuracy during drilling processing is further improved.

The content of the low-molecular-weight water-soluble resin (B-2) is not particularly limited but is preferably 30 parts by mass or more and 74 parts by mass or less, more preferably 35 parts by mass or more and 74 parts by mass or less, and still more preferably 40 parts by mass or more and 70 parts by mass or less based on 100 parts by mass of the total of the polyolefin resin (A) and the water-soluble resin (B). When the content of the low-molecular-weight water-soluble resin (B-2) is in the range, there is a tendency that both the adhesion strength between the metallic foil and the layer of the resin composition and the hole position accuracy during drilling processing are further excellent.

(Other Components)

If necessary, the layer of the resin composition may contain an additive. The type of additive is not particularly limited, and examples thereof include a surface conditioner, a leveling agent, an antistatic agent, an emulsifying agent, an antifoaming agent, a wax additive, a coupling agent, a rheology control agent, an antiseptic agent, an antifungal agent, an antioxidant, a light stabilizer, a nucleating agent such as Na formate, a solid lubricant such as graphite, an organic filler, an inorganic filler, a heat stabilizer, and a coloring agent.

(Thickness of Layer of Resin Composition)

The thickness of the layer of the resin composition can be appropriately selected according to the diameter of the drill bit that is used in conducting drilling processing, the constitution of the object of drilling to which processing is conducted (for example, printed wiring board material such as laminated board or multi-layer board), and the like. The thickness of the layer of the resin composition is not particularly limited but is preferably from 0.02 to 0.3 mm, more preferably 0.02 to 0.2 mm. When the layer of the resin composition has a thickness of 0.02 mm or more, a further sufficient lubricating effect can be obtained to reduce the load to the drill bit, so that there is a tendency that the breakage of the drill bit can be further suppressed. Moreover, when the resin composition layer has a thickness of 0.3 mm or less, there is a tendency that winding of the resin composition to the drill bit can be suppressed.

[Method for Producing Entry Sheet for Drilling]

The method for producing the entry sheet for drilling according to the present embodiment is not particularly limited, and general production methods can be used as long as the production methods are methods for forming a layer of a resin composition on a metallic foil.

The method for forming the layer of the resin composition is not particularly limited, and publicly known methods can be used. Examples of the methods include a method in which a solution of the resin composition, which is obtained by dissolving or dispersing the aqueous dispersion of the polyolefin resin (A); the water-soluble resin (B); and, an additive which is added if necessary in a solvent, is applied on the metallic foil by a coating method or the like, and then the applied solution is further dried and/or cooled to be solidified.

In the case where the layer of the resin composition is formed by applying the solution of the resin composition on the metallic foil by a coating method or the like and then drying the applied solution, it is preferable that the solvent that is used in the solution of the resin composition be a mixed solution containing water and a solvent having a boiling point that is lower than the boiling point of water. The use of the mixed solution containing water and the solvent having a boiling point that is lower than the boiling point of water can reduce residual bubbles in the layer of the resin composition efficiently. The type of solvent having a boiling point that is lower than the boiling point of water is not particularly limited, but examples thereof include alcoholic compounds such as ethanol, methanol, and isopropyl alcohol, and a low boiling point solvent such as methyl ethyl ketone and acetone can also be used. As another solvent, a solvent obtained by mixing tetrahydrofuran or acetonitrile, which has a high compatibility with the resin composition, in water or the alcoholic compound can be used.

It is to be noted that the state of the polyolefin resin (A) in producing the entry sheet for drilling, namely the state of the polyolefin resin (A) in forming the layer of the resin composition is not particularly limited but is preferably a state of an aqueous dispersion. The method for producing the aqueous dispersion of the polyolefin resin (A) is not particularly limited, and publicly known methods can be used. Examples of the methods include a method in which the above-described olefin-unsaturated carboxylic acid copolymer, an aqueous solvent, and, if necessary, an additional component such as a base or an emulsifying agent are stirred using a solid-liquid stirring apparatus or the like.

The base that is used for producing the aqueous dispersion of the polyolefin resin (A) is not particularly limited. Examples thereof include: ammonia; amine compounds such as diethylamine, triethylamine, monoethanolamine, dimethylethanolamine, and diethylethanolamine; and alkali metal hydroxides such as sodium hydroxide and potassium hydroxide, and diethylamine, triethylamine, monoethanolamine, dimethylethanolamine, and diethylethanolamine are preferable from the viewpoint of compatibility with solvents in preparing a solution of the resin composition for forming the layer of the resin composition described below.

The emulsifying agent that is used for producing the aqueous dispersion of the polyolefin resin (A) is not particularly limited. Examples thereof include: saturated fatty acids such as stearic acid, lauric acid, tridecylic acid, myristic acid, and palmitic acid; and unsaturated fatty acids such as linolenic acid, linoleic acid, and oleic acid, and stearic acid is preferable from the viewpoint of compatibility with aqueous solvents and oxidation resistance.

As the aqueous dispersion of the polyolefin resin (A), a commercially available product may be used. Examples of the commercially available aqueous dispersion of the polyolefin resin (A) include Hightech S3121 (ethylene-acrylic acid copolymer, weight average molecular weight of $6\times10^4$, ratio of number of structural units derived from ethylene: number of structural units derived from acrylic acid=90:10, stearic acid is blended as emulsifying agent) manufactured by TOHO Chemical Industry Co., Ltd. and ZAIKTHENE L (ethylene-acrylic acid copolymer, weight average molecular weight of $5 \times 10^4$, ratio of number of structural units derived from ethylene:number of structural units derived from acrylic acid=70:30, dimethylethanolamine is blended as base) manufactured by Sumitomo Seika Chemicals Co., Ltd.

[Use]

The entry sheet for drilling according to the present embodiment is preferably used for drilling processing of a laminated board or a multi-layer board because the object of the present invention can be achieved further efficiently and surely. Although generally a "copper clad laminated board" is often used as the laminated board, the laminated board in the present embodiment may be a "laminated board that does not have copper foil on an outer layer". In the present embodiment, the laminated board refers to the "copper clad laminated board" and/or the "laminated board that does not have copper foil on an outer layer" unless otherwise stated. Moreover, when the drilling processing is conducted with a drill bit having a diameter (drill bit diameter) of 0.30 mmφ or less, the object of the present embodiment can be achieved further efficiently and surely. Particularly, the drilling processing, when used for the drill bits having a small diameter, as small as a diameter of 0.05 mmφ or more and 0.30 mmφ or less, further, as small as a diameter of 0.05 mmφ or more and 0.20 mmφ or less where the hole position accuracy matters, is suitable in that the hole position accuracy and the life of the drills are greatly improved. It is to be noted that the drill bit diameter of 0.05 mmφ is the lower limit of the diameter for available drill bits, and if a drill bit having a diameter smaller than that becomes available, the above-described range becomes different. Moreover, there is no problem even when the entry sheet for drilling according to the present embodiment is adopted for drilling processing in which a drill bit having a diameter exceeding 0.30 mmφ is used.

The entry sheet for drilling according to the present embodiment can be used suitably in conducting drilling processing for, for example, a printed wiring board material, more specifically, a laminated board or a multi-layer board. Specifically, the drilling processing can be conducted from the upper surface (layer side of resin composition) of the entry sheet for drilling by arranging the entry sheet on at least the top surface of a laminated board or a multi-layer board or a plurality of piled laminated boards or piled multi-layer boards (a printed wiring board material) so that the metallic foil side can be in contact with the printed wiring board material.

[Method for Drilling Processing]

The method for drilling processing according to the present embodiment includes a step of forming a hole in a laminated board or a multi-layer board using the entry sheet for drilling. When the hole is formed, a drill may be penetrated from the side of the layer of the resin composition in the entry sheet for drilling, or a drill may be penetrated from the metallic foil side as illustrated in FIG. 1.

EXAMPLES

Hereinafter, the effects of Examples according to the present invention will be described comparing with Comparative Examples that are out of the range of the present invention. It is to be noted that "polyethylene glycol" is sometimes abbreviated as "PEG", "polyethylene oxide" as "PEO", and "polyvinylpyrrolidone" as "PVP".

Hereinafter, the method for measuring the adhesion force and the method for measuring the hole position accuracy in Examples and Comparative Examples will be described.

<Method for Measuring Adhesion Force>

The adhesion force was measured in the following manner. Firstly, three samples were each prepared by cutting each entry sheet for drilling made in Examples and Comparative Examples in a width of 3 mm and a length of 100 mm. Subsequently, a double-sided tape was stuck to the whole surface of the layer of the resin composition on each sample. Thereafter, one edge of the samples, to which the double-sided tape was stuck, was peeled in a length of 10 mm, and a jig for attaching a spring scale was attached to the metallic foil portion in the peeled samples. The spring scale (manufactured by Sanko Seikohjyo Co. Ltd., maximum measurable value of 1000 gf) was attached to the jig, and was pulled at a speed of 1 cm/sec to read the numerical value shown by the spring scale. The measurement was conducted for the three samples, and the mean of the three numerical values was determined as the numerical value of the adhesion force. When the metallic foil and the layer of the resin composition were not peeled, the result was denoted as ">1000".

When the adhesion force between the metallic foil and the layer of the resin composition is weak, the layer of the resin composition is peeled because the load at the time of processing is applied to the entry sheet during drilling processing. As a result of diligent studies conducted by the present inventors, it has become clear that when the adhesion force is 200 gf or more, the layer of the resin composition is not peeled during drilling processing, and therefore the decision criteria for the adhesion force have been determined as follows.

○: 200 gf or more

X: less than 200 gf

<Measurement of Hole Position Accuracy>

The hole position accuracy was measured as follows. Each entry sheet for drilling made in Examples and Comparative Examples was arranged, with the layer of the resin composition facing upward, on piled copper clad laminated boards, and a predetermined number of times of drilling processing was conducted. The shift of the hole position at the back surface (lower surface) of the lowest board of the piled copper clad laminated boards from the designated coordinate was measured using a hole analyzer (type number: HA-1AM, manufactured by Hitachi Via Mechanics, Ltd.) for all the holes bored by the predetermined number of times of drilling processing. The mean and the standard deviation (σ) of the obtained shifts were calculated to work out the "mean+3σ" for each drill bit. Thereafter, as the hole position accuracy of the whole drilling processing, the mean of the "mean+3σ" for each drill bit was worked out for n drill bits used. The expression used for working out the hole position accuracy is as follows.

Hole position accuracy of whole drilling processing (μm) =

$$\left( \sum_{i=1}^{n} \text{"mean} + 3\sigma_i\text{" of drill bit} \right) \div n$$

In the expression, n represents the number of drills used.

Conditions of drilling processing in Examples and Comparative Examples are as follows. Each entry sheet for drilling was arranged, with the side of the layer of the resin composition to be the upper side, on the upper surface of 5 piled copper clad laminated boards (trade name: HL 832, thickness of copper foil of 12 μm, double-sided board, manufactured by Mitsubishi Gas Chemical Company, Inc.) each having a thickness of 0.2 mm, and an entry board (paper phenolic laminated board PS1160-G, manufactured by RISHO KOGYO CO., LTD.) having a thickness of 1.5 mm was arranged at the back surface (lower surface) of the lowest board of the piled copper clad laminated boards. Drilling was conducted using 0.2 mmφ drill bits (trade name: C-CFU020S manufactured by Tungaloy Corporation) under the conditions of the number of rotations: 200,000 rpm and the feeding speed: 2.6 m/min. Two drill bits were used for drilling and drilling of 3,000 holes was conducted for each drill bit. The evaluation of the hole position accuracy was conducted for all the 3,000 holes.

The hole position accuracy was decided based on the hole position accuracy worked out using the calculation formula. The decision criteria for the hole position accuracy are as follows.

○: 18 μm or less
X: exceeding 18 μm

<Raw Materials>

Raw materials used for producing the entry sheets for drilling of Examples and Comparative Examples are shown in Table 1. It is to be noted that the signs described below are used in Tables 3 to 4.

TABLE 1

| | Raw material | | Trade name | Sign | Manufacturer | Notes |
|---|---|---|---|---|---|---|
| | Polyolefin resin (A) | | Hightech S3121 | (a) | TOHO Chemical Industry Co., Ltd. | Block copolymer |
| | | | ZAIKTHENE L | (b) | Sumitomo Seika Chemicals Co., Ltd. | Block copolymer |
| | Acrylic resin | | VONCOAT AN1190S | (c) | DIC Corporation | — |
| | | | VONCOAT AB886 | (d) | DIC Corporation | — |
| | Polyurethane resin | | HYDRAN ADS110 | (e) | DIC Corporation | — |
| Water-soluble resin (B) | High-molecular-weight water-soluble resin (B-1) | Polyethylene oxide | ALKOX E-45 | (f-1) | Meisei Chemical Works, Ltd. | Mw = 5.6 × 10$^5$ |
| | | | ALTOP MG150 | (f-2) | Meisei Chemical Works, Ltd. | Mw = 1.5 × 10$^5$ |
| | | Polyvinylpyrrolidone | PITZCOL K90 | (g) | DKS Co., Ltd. | Mw = 1.2 × 10$^6$ |
| | Low-molecular-weight water-soluble resin (B-2) | Polyethylene glycol | PEG4000S | (h-1) | Sanyo Chemical Industries, Ltd. | Mw = 3.3 × 10$^3$ |
| | | | PEG20000 | (h-2) | Sanyo Chemical Industries, Ltd. | Mw = 2.0 × 10$^4$ |
| | Molybdenum disulfide | | M-5 powder | (j) | DAIZO CORPORATION | — |
| | Sodium formate | | — | | Mitsubishi Gas Chemical Company, Inc. | — |
| | Surface conditioner | | BYK-349 | — | BYK Japan KK | — |
| Solvent | | Ion-exchanged water | — | — | — | — |
| | | Methanol | | — | Mitsubishi Gas Chemical Company, Inc. | — |
| | Aluminum foil | | JIS-A1100H18 | — | Mitsubishi Aluminum Co., Ltd. | Thickness: 0.1 mm |

Specifications of polyolefin resins (A), and acrylic resins and a urethane resin which were used in Comparative Examples in place of the polyolefin resins (A) are shown in Table 2. The polyolefin resins (A), acrylic resins and the urethane resin were each an aqueous dispersion, and the amount (% by mass) of the solid content of the resin in the aqueous dispersion is as described below. In addition, any of the polyolefin resins (A) is an ethylene-acrylic acid copolymer, and the ratio of the number of structural units derived from ethylene (m) and the number of structural units derived from (meth)acrylic acid (n) (m:n) and the weight average molecular weight are as shown below. It is to be noted that the ratio (m:n) was worked out from a $^1$H-NMR method and a DQF-COSY method each being one of various kinds of nuclear magnetic resonance spectrophotometry. In addition, the weight average molecular weight was measured by the method described later.

TABLE 2

| | Trade name | Sign | m:n | Weight average molecular weight | Solid concentration of resin (% by mass) |
|---|---|---|---|---|---|
| Polyolefin resin (A) | Hightech S3121 | (a) | 90:10 | 60,000 | 25 |
| | ZAIKTHENE L | (b) | 70:30 | 50,000 | 25 |
| Acrylic resin | VONCOAT AN1190S | (c) | — | — | 45 |
| | VONCOAT AB886 | (d) | — | — | 45 |
| Polyurethane resin | HYDRAN ADS110 | (e) | — | — | 50 |

*1 m:n; ratio of the number of structural units derived from ethylene (m) to the number of structural units derived from (meth)acrylic acid (n)

<Method for Measuring Weight Average Molecular Weight of Polyolefin Resin (A)>

The weight average molecular weight of the polyolefin resin (A) was measured using polystyrene as a standard substance with liquid chromatography (manufactured by SHIMADZU CORPORATION) equipped with a GPC column and was worked out as a relative average molecular weight. The devices used and analysis conditions are described below.

(Devices Used)

SHIMADZU high-performance liquid chromatograph Prominence LIQUID

System controller: CBM-20A
Liquid-feeding unit: LC-20AD
On-line degasser: DGU-20A3
Auto sampler: SIL-20AHT
Column oven: CTO-20A
Differential refractive index detector: RIO-10A
LC workstation: LCSolution (Analysis Conditions)

Columns: Columns manufactured by Phenomenex, Inc. were connected in series in the following order.

Phenogel 5μ 10E5A 7.8×300×1 column
Phenogel 5μ 10E4A 7.8×300×1 column
Phenogel 5μ 10E3A 7.8×300×1 column
Guard Column: Phenogel guard column 7.8×50×1 column manufactured by Phenomenex, Inc.

Eluent:Tetrahydrofuran for a high-performance liquid chromatograph manufactured by KANTO CHEMICAL CO., INC.

Flow rate: 1.00 mL/min
Column temperature: 45° C.

(Polystyrene for Making Calibration Curve)

Shodex standard SL105, SM105 manufactured by Showa Denko K.K.

Weight average molecular weight of standard polystyrene: 580, 1390, 2750, 6790, 13200, 18500, 50600, 123000, 259000, 639000, 1320000, 2480000

Hereinafter, the method for producing the entry sheets for drilling in Examples and Comparative Examples will be described.

Example 1

In a water/methanol mixed solvent (mass ratio of 50/50), 100 parts by mass (25 parts by mass in terms of solid content of resin) of an aqueous dispersion of a polyolefin resin (A) (trade name: Hightech S3121, TOHO Chemical Industry Co., Ltd., weight average molecular weight of $6 \times 10^4$, m:n=90:10), 7.5 parts by mass of a polyethylene oxide (trade name: ALKOX E-45, manufactured by Meisei Chemical Works, Ltd., weight average molecular weight of $5.6 \times 10^5$) being a high-molecular-weight water-soluble resin (B-1), 67.5 parts by mass of a polyethylene glycol (trade name: PEG 4000S, manufactured by Sanyo Chemical Industries, Ltd., weight average molecular weight of $3.3 \times 10^3$) being a low-molecular-weight water-soluble resin (B-2) were dissolved to prepare a solution having a solid concentration as a resin composition of 30% by mass. Based on 100 parts by mass of the solid content of the resin composition in this solution, 1.2 parts by mass of a surface conditioner (BYK-349, manufactured by BYK Japan KK) was added, and further, 0.25 parts by mass of sodium formate (manufactured by Mitsubishi Gas Chemical Company, Inc.) was added based on 100 parts by mass of the solid content of the resin composition in the solution to disperse the resultant mixture uniformly, thereby obtaining a solution of a resin composition for forming a layer of the resin composition. The obtained solution of the resin composition was applied on an aluminum foil (aluminum foil used: JIS-A1100 H1.80, thickness of 0.1 mm, manufactured by Mitsubishi Aluminum Co., Ltd.) using a bar coater so that the layer of the resin composition would have a thickness after drying and solidification of 0.05 mm. Subsequently, the applied solution was dried at 120° C. for 3 minutes using a dryer and was then cooled and solidified to make an entry sheet for drilling. The adhesion force between the metallic foil and the layer of the resin composition of the entry sheet for drilling was measured 3 times by the above-described method to determine the mean. Subsequently, drilling processing was conducted by the above-described method to measure the hole position accuracy. These results are shown in Table 3.

Examples 2 to 14

In accordance with Example 1, solutions of resin compositions were prepared according to the types and blending quantities of raw materials shown in Table 3 to make entry sheets for drilling each having a thickness of the layer of the resin composition after drying and solidification of 0.05 mm. The adhesion force between the metallic foil and the layer of the resin composition and the hole position accuracy were measured for the obtained entry sheets for drilling. These results are shown in Table 3.

Examples 15 to 17

Solutions of resin compositions were prepared according to the types and blending quantities of raw materials shown in Table 3 to make entry sheets for drilling each having a thickness of the layer of the resin composition after drying and solidification of 0.05 mm in accordance with Example 1 except that a solvent having a mass ratio of water/methanol of 100/0 was used as the solvent for preparing the solutions of the resin compositions in place of the mixed solvent having a mass ratio of water/methanol of 50/50. The adhesion force between the metallic foil and the layer of the resin composition and the hole position accuracy were measured for the obtained entry sheets for drilling. These results are shown in Table 3.

Comparative Examples 1 to 14

In accordance with Example 1, solutions of resin compositions were prepared according to the types and blending quantities of raw materials shown in Table 4 to make entry sheets for drilling each having a thickness of the layer of the resin composition after drying and solidification of 0.05 mm. The adhesion force between the metallic foil and the layer of the resin composition and the hole position accuracy were measured for the obtained entry sheets for drilling. These results are shown in Table 4.

Comparative Example 15

In a water/MeOH (methanol) mixed solution, 30 parts by mass of a polyethylene oxide having a weight average molecular weight of $1.5 \times 10^5$ (manufactured by Meisei Chemical Works, Ltd., trade name: ALTOP MG-150) and 70 parts by mass of a polyethylene glycol having a weight average molecular weight of $2 \times 10^4$ (manufactured by Sanyo Chemical Industries, Ltd., trade name: PEG 20000) were dissolved so that the solid content of the resin would be 30% by mass. The ratio of water to MeOH in this case was 60/40 in terms of the mass ratio. Further, 80 parts by mass of molybdenum disulfide (manufactured by DAIZO CORPORATION, range of particle diameter: 0.5 μm to 29 μm, average particle diameter: 5 μm, purity of molybdenum disulfide: 98%, friction coefficient μ: 0.4) was blended as a solid lubricant in the solution of the water-soluble resin composition based on 100 parts by mass of the resins contained in the water-soluble resin composition, and then the resultant mixture was dispersed sufficiently. The solution of the resin composition thus obtained was applied on an aluminum foil (aluminum foil used: 1100, thickness of 0.1 mm, manufactured by Mitsubishi Aluminum Co., Ltd.) using a bar coater without interposing a resin coat, such as an epoxy resin coat, having an adhesion function so that the thickness of the layer of the resin composition after drying would be 0.05 mm. The applied solution was dried in a dryer at 120° C. for 5 minutes and was then cooled to normal temperature, thereby making an entry sheet for drilling.

[Comprehensive Decision]

The comprehensive decision shown in Tables 3 to 4 is as follows. When both the decision of the adhesion force and the decision of the hole position accuracy are "○", the comprehensive decision is denoted as "○" because the adhesion force between the metallic foil and the layer of the resin composition is strong and the hole position accuracy is excellent, and when at least one of the decision of the hole position accuracy and the decision of the adhesion force is "X", the comprehensive decision is denoted as "X".

TABLE 3

| Classification | Polyolefin resin (A) Sign | Polyolefin resin (A) Parts by mass | Water-soluble resin (B) (B-1) Sign | Water-soluble resin (B) (B-1) Parts by mass | Water-soluble resin (B) (B-2) Sign | Water-soluble resin (B) (B-2) Parts by mass | Molybdenum disulfide Sign | Molybdenum disulfide Parts by mass | Adhesion force gf | Hole position accuracy μm | Decision of adhesion force | Decision of hole position accuracy | Comprehensive decision |
|---|---|---|---|---|---|---|---|---|---|---|---|---|---|
| Example 1 | (a) | 25.0 | (f-1) | 7.5 | (h-1) | 67.5 | — | 0.0 | 210 | 16.1 | ○ | ○ | ○ |
| Example 2 | (a) | 30.0 | (f-1) | 7.0 | (h-1) | 63.0 | — | 0.0 | 247 | 15.9 | ○ | ○ | ○ |
| Example 3 | (a) | 32.0 | (f-1) | 6.8 | (h-1) | 61.2 | — | 0.0 | 313 | 16.7 | ○ | ○ | ○ |
| Example 4 | (a) | 34.0 | (f-1) | 6.6 | (h-1) | 59.4 | — | 0.0 | >1000 | 16.6 | ○ | ○ | ○ |
| Example 5 | (a) | 35.0 | (f-1) | 6.5 | (h-1) | 58.5 | — | 0.0 | >1000 | 15.5 | ○ | ○ | ○ |
| Example 6 | (a) | 40.0 | (f-1) | 6.0 | (h-1) | 54.0 | — | 0.0 | >1000 | 16.0 | ○ | ○ | ○ |
| Example 7 | (a) | 40.0 | (f-1) | 10.0 | (h-1) | 50.0 | — | 0.0 | 380 | 17.0 | ○ | ○ | ○ |
| Example 8 | (a) | 50.0 | (f-1) | 5.0 | (h-1) | 45.0 | — | 0.0 | >1000 | 14.8 | ○ | ○ | ○ |
| Example 9 | (a) | 50.0 | (f-1) | 10.0 | (h-1) | 40.0 | — | 0.0 | >1000 | 15.9 | ○ | ○ | ○ |
| Example 10 | (b) | 25.0 | (f-1) | 7.5 | (h-1) | 67.5 | — | 0.0 | 350 | 17.3 | ○ | ○ | ○ |
| Example 11 | (b) | 30.0 | (f-1) | 7.0 | (h-1) | 63.0 | — | 0.0 | 340 | 17.6 | ○ | ○ | ○ |
| Example 12 | (b) | 35.0 | (f-1) | 6.5 | (h-1) | 58.5 | — | 0.0 | >1000 | 17.4 | ○ | ○ | ○ |
| Example 13 | (b) | 45.0 | (f-1) | 5.5 | (h-1) | 49.5 | — | 0.0 | >1000 | 17.8 | ○ | ○ | ○ |
| Example 14 | (b) | 50.0 | (f-1) | 5.0 | (h-1) | 45.0 | — | 0.0 | >1000 | 16.5 | ○ | ○ | ○ |
| Example 15 | (a) | 31.0 | (g) | 20.0 | (h-1) | 49.0 | — | 0.0 | 350 | 14.9 | ○ | ○ | ○ |
| Example 16 | (a) | 31.0 | (f-1) + (g) | 6.9 + 10 | (h-1) | 52.1 | — | 0.0 | >1000 | 12.8 | ○ | ○ | ○ |
| Example 17 | (a) | 31.0 | (f-1) + (g) | 6.9 + 20 | (h-1) | 42.1 | — | 0.0 | 220 | 13.5 | ○ | ○ | ○ |

TABLE 4

| Classification | Polyolefin resin (A) or another resin Sign | Polyolefin resin (A) or another resin Parts by mass | Water-soluble resin (B) (B-1) Sign | Water-soluble resin (B) (B-1) Parts by mass | Water-soluble resin (B) (B-2) Sign | Water-soluble resin (B) (B-2) Parts by mass | Molybdenum disulfide Sign | Molybdenum disulfide Parts by mass | Adhesion force gf | Hole position accuracy μm | Decision of adhesion force | Decision of hole position accuracy | Decision of hole position accuracy |
|---|---|---|---|---|---|---|---|---|---|---|---|---|---|
| Comparative Example 1 | — | 0.0 | (f-1) | 10.0 | (h-1) | 90.0 | — | 0.0 | 0 | 21.5 | X | X | X |
| Comparative Example 2 | (a) | 5.0 | (f-1) | 9.5 | (h-1) | 85.5 | — | 0.0 | 0 | 40.8 | X | X | X |
| Comparative Example 3 | (a) | 10.0 | (f-1) | 9.0 | (h-1) | 81.0 | — | 0.0 | 0 | 39.1 | X | X | X |
| Comparative Example 4 | (a) | 20.0 | (f-1) | 8.0 | (h-1) | 72.0 | — | 0.0 | 97 | 18.2 | X | X | X |
| Comparative Example 5 | (b) | 5.0 | (f-1) | 9.5 | (h-1) | 85.5 | — | 0.0 | 0 | 35.6 | X | X | X |
| Comparative Example 6 | (b) | 10.0 | (f-1) | 9.0 | (h-1) | 81.0 | — | 0.0 | 0 | 30.1 | X | X | X |
| Comparative Example 7 | (b) | 15.0 | (f-1) | 8.5 | (h-1) | 76.5 | — | 0.0 | 75 | 33.9 | X | X | X |
| Comparative Example 8 | (b) | 20.0 | (f-1) | 8.0 | (h-1) | 72.0 | — | 0.0 | 160 | 27.1 | X | X | X |
| Comparative Example 9 | (b) | 75.0 | (f-1) | 2.5 | (h-1) | 22.5 | — | 0.0 | >1000 | 18.5 | ○ | X | X |
| Comparative Example 10 | (c) | 25.0 | (f-1) | 7.5 | (h-1) | 67.5 | — | 0.0 | 0 | 53.3 | X | X | X |
| Comparative Example 11 | (d) | 25.0 | (f-1) | 7.5 | (h-1) | 67.5 | — | 0.0 | 0 | 19.3 | X | X | X |
| Comparative Example 12 | (e) | 25.0 | (f-1) | 7.5 | (h-1) | 67.5 | — | 0.0 | 0 | 65.5 | X | X | X |
| Comparative Example 13 | (e) | 50.0 | (f-1) | 5.0 | (h-1) | 45.0 | — | 0.0 | 0 | 35.7 | X | X | X |

TABLE 4-continued

| Classification | Polyolefin resin (A) or another resin Sign | Parts by mass | Water-soluble resin (B) | | | | Molybdenum disulfide | | Adhesion force gf | Hole position accuracy μm | Decision of adhesion force | Decision of hole position accuracy | Decision of hole position accuracy |
| --- | --- | --- | --- | --- | --- | --- | --- | --- | --- | --- | --- | --- | --- |
| | | | (B-1) | | (B-2) | | | | | | | | |
| | | | Sign | Parts by mass | Sign | Parts by mass | Sign | Parts by mass | | | | | |
| Comparative Example 14 | (a) | 25.0 | (f-2) | 7.5 | (h-1) | 67.5 | — | 0.0 | 0 | 21.7 | X | X | X |
| Comparative Example 15 | — | 0.0 | (f-2) | 30.0 | (h-2) | 70.0 | (j) | 80.0 | 0 | 19.0 | X | X | X |

It was understood from Examples 1 to 17 in Table 3 that when the content of the polyolefin resin (A) in the layer of the resin composition of the entry sheet for drilling is from 25 parts by mass to 50 parts by mass based on 100 parts by mass of the total of the polyolefin resin (A) and the water-soluble resin (B), and the water-soluble resin (B) comprises the high-molecular-weight water-soluble resin (B-1), the adhesion force between the metallic foil and the layer of the resin composition of the entry sheet for drilling is strong, and the hole position accuracy in drilling processing using the entry sheet is satisfactory.

In contrast, in Comparative Examples 1 to 8, when the content of the polyolefin resin (A) in the layer of the resin composition was less than 25 parts by mass based on 100 parts by mass of the total of the polyolefin resin (A) and the water-soluble resin (B), the adhesion force between the metallic foil and the layer of the resin composition of the entry sheet for drilling was weak, and in drilling processing using the entry sheet, peeling of the layer of the resin composition occurred and the hole position accuracy was deteriorated.

In addition, in Comparative Example 9 where the content of the polyolefin resin (A) in the layer of the resin composition exceeded 50 parts by mass, the adhesion force of the metallic foil and the layer of the resin composition of the entry sheet for drilling was strong, but the performance of discharging cutting chips was poor and the hole position accuracy was deteriorated during drilling processing because the content of the water-soluble resin (B) having a lubricating effect was small.

In Comparative Examples 10 to 13 where the acrylic resins or the polyurethane resin was used in place of the polyurethane resins (A), the adhesion force between the metallic foil and the layer of the resin composition of the entry sheet for drilling was weak, and in drilling processing using the entry sheet, peeling of the layer of the resin composition occurred and the hole position accuracy was deteriorated.

In the case, such as Comparative Example 14, where the high-molecular-weight water-soluble resin (B-1) is not contained, the adhesion force between the metallic foil and the layer of the resin composition of the entry sheet for drilling was weak, and in drilling processing using the entry sheet, peeling of the layer of the resin composition occurred and the hole position accuracy was deteriorated.

Furthermore, it is understood that in the case, such as Comparative Example 15, where the entry sheet for drilling is made without interposing a resin coat although in conventional entry sheets for drilling, a layer of a resin composition has been formed on an aluminum foil with a resin coat, which has an adhesion function, the layer of the resin composition hardly adheres to the metallic foil and the hole position accuracy is deteriorated.

From what is described above, it was understood that the adhesion force between the metallic foil and the layer of the resin composition of the entry sheet for drilling is strong and the hole position accuracy is satisfactory in drilling processing using the entry sheet when the content of the polyolefin resin (A) in the layer of the resin composition that constitutes the entry sheet for drilling is 25 parts by mass or more and 50 parts by mass or less based on 100 parts by mass of the total of the polyolefin resin (A) and the water-soluble resin (B); the content of the water-soluble resin (B) in the layer of the resin composition is 50 parts by mass or more and 75 parts by mass or less based on 100 parts by mass of the total of the polyolefin resin (A) and the water-soluble resin (B); and the water-soluble resin (B) comprises the high-molecular-weight water-soluble resin (B-1) having a weight average molecular weight of $2\times10^5$ or higher and $1.5\times10^6$ or lower.

According to the present invention, it has been shown that an entry sheet for drilling can be provided which has a more excellent hole position accuracy, which suppresses occurrence of breakage of a drill more due to peeling of a layer of a resin composition from a metallic foil, and which has a more excellent economy because an adhesion layer that has been necessary conventionally becomes unnecessary than conventional entry sheets for drilling.

The present application claims priority based on Japanese Patent Application (Japanese Patent Application No. 2015-172761) filed with Japan Patent Office on Sep. 2, 2015, the contents of which are hereby incorporated with reference.

The entry sheet for drilling according to the present invention has industrial applicability in drilling processing of a laminated board or a multi-layer board.

The invention claimed is:

1. An entry sheet for drilling comprising:
   a metallic foil; and
   a layer of a resin composition on at least one surface of the metallic foil, the resin composition comprising a polyolefin resin (A) and a water-soluble resin (B), wherein
   a content of the polyolefin resin (A) is 25 parts by mass or more and 50 parts by mass or less based on 100 parts by mass of a total of the polyolefin resin (A) and the water-soluble resin (B),
   a content of the water-soluble resin (B) is 50 parts by mass or more and 75 parts by mass or less based on 100 parts by mass of the total of the polyolefin resin (A) and the water-soluble resin (B), and
   the water-soluble resin (B) comprises a high-molecular-weight water-soluble resin (B-1) having a weight average molecular weight of $2\times10^5$ or higher and $1.5\times10^6$ or lower,
   a content of the high-molecular-weight water-soluble resin (B-1) is 2.5 parts by mass or more and 40 parts by mass or less based on 100 parts by mass of the total of the polyolefin resin (A) and the water-soluble resin (B), wherein the water-soluble resin (B) comprises a low-molecular-weight water-soluble resin (B-2) having a weight average molecular weight of $1 \times 10^3$ or higher and $7 \times 10^3$ or lower.

2. The entry sheet for drilling according to claim 1, wherein the polyolefin resin (A) comprises an olefin-(meth)acrylic acid copolymer having a constituent unit derived from an olefin and a constituent unit derived from acrylic acid and/or methacrylic acid.

3. The entry sheet for drilling according to claim 2, wherein the constituent unit derived from the olefin comprises a constituent unit derived from ethylene.

4. The entry sheet for drilling according to claim 2, wherein the olefin-(meth)acrylic acid copolymer is an ethylene-(meth)acrylic acid block copolymer having a structure represented by the following formula (1):

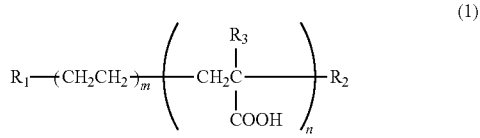

(1)

wherein $R_1$, $R_2$, and $R_3$ each independently represent a hydrogen atom or a methyl group, and m and n each independently represent an integer of 1 or more.

5. The entry sheet for drilling according to claim 2, wherein a content of the constituent unit derived from the olefin in the olefin-(meth)acrylic acid copolymer is 60 to 99 mol % based on 100 mol % of a total of the constituent unit derived from an olefin and the constituent unit derived from acrylic acid and/or methacrylic acid.

6. The entry sheet for drilling according to claim 1, wherein the polyolefin resin (A) has a weight average molecular weight of $5 \times 10^3$ or higher and $1 \times 10^5$ or lower.

7. The entry sheet for drilling according to claim 1, wherein the water-soluble resin (B) comprises one or more selected from the group consisting of polyethylene oxide; polypropylene oxide; polyvinylpyrrolidone; cellulose derivatives; polyethylene glycol; polypropylene glycol; polytetramethylene glycol; monoether compounds of polyoxyethylene; polyoxyethylene monostearate; polyoxyethylene sorbitan monostearate; polyglycerin monostearate compounds; a polyethylene oxide-polypropylene oxide copolymer; and derivatives thereof.

8. The entry sheet for drilling according to claim 1, wherein the layer of the resin composition has a thickness of 0.02 to 0.3 mm.

9. The entry sheet for drilling according to claim 1, wherein the metallic foil has a thickness of 0.05 to 0.5 mm.

10. A method for drilling processing, the method comprising forming a hole in a laminated board or a multi-layer board using the entry sheet for drilling according to claim 1.

* * * * *